(12) United States Patent
Kim

(10) Patent No.: US 9,886,197 B2
(45) Date of Patent: Feb. 6, 2018

(54) MEMORY SYSTEM AND WRITE AND READ OPERATION METHOD FOR THE SAME

(71) Applicant: SK hynix Inc., Gyeonggi-do (KR)

(72) Inventor: Dong-Gun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/353,844

(22) Filed: Nov. 17, 2016

(65) Prior Publication Data

US 2017/0336985 A1    Nov. 23, 2017

(30) Foreign Application Priority Data

May 18, 2016  (KR) .................... 10-2016-0060803

(51) Int. Cl.
*G06F 3/06*  (2006.01)
*G11C 16/10*  (2006.01)
*G11C 16/26*  (2006.01)
*G11C 16/16*  (2006.01)
*G11C 16/04*  (2006.01)

(52) U.S. Cl.
CPC ............ *G06F 3/0608* (2013.01); *G06F 3/064* (2013.01); *G06F 3/0653* (2013.01); *G06F 3/0659* (2013.01); *G06F 3/0679* (2013.01); *G11C 16/0483* (2013.01); *G11C 16/10* (2013.01); *G11C 16/16* (2013.01); *G11C 16/26* (2013.01)

(58) Field of Classification Search
CPC ...... G06F 3/0608; G06F 3/064; G06F 3/0653; G06F 3/0679; G11C 16/0483; G11C 16/10; G11C 16/16; G11C 16/26
See application file for complete search history.

(56) References Cited

U.S. PATENT DOCUMENTS

| | | | | |
|---|---|---|---|---|
| 7,409,527 B2* | 8/2008 | Hu | ........................ | G06F 12/023 711/217 |
| 7,761,774 B2 | 7/2010 | Fischer et al. | | |
| 8,438,325 B2 | 5/2013 | Reid et al. | | |
| 8,595,412 B2* | 11/2013 | Kwon | ................. | G06F 12/0246 711/103 |
| 2017/0010833 A1* | 1/2017 | Lu | ........................ | G06F 12/0246 |

* cited by examiner

*Primary Examiner* — Vanthu Nguyen
(74) *Attorney, Agent, or Firm* — IP & T Group LLP

(57) ABSTRACT

A method for operating a memory system includes detecting a size of a data requested by a host, generating a first data that represents the size of the requested data and a second data that represents a remaining empty space other than a space for the requested data in a first region having a unit size of data storage in a memory device when the size of the requested data is smaller than the first region and the request is to write the requested data into the memory device, and storing the first data and the second data in the memory device along with the requested data.

18 Claims, 4 Drawing Sheets

MEMORY SYSTEM AND WRITE AND READ OPERATION METHOD FOR THE SAME

CROSS-REFERENCE TO RELATED APPLICATIONS

The present application claims priority under 35 U.S.C. § 119(a) to Korean Patent Application No. 10-2016-0060803, filed on May 18, 2016, which is incorporated herein by reference in its entirety.

BACKGROUND

1. Field

Exemplary embodiments of the present invention relate generally to an operation of a memory system for managing a data storage space.

2. Description of the Related Art

The paradigm for computing environments is shifting toward ubiquitous computing which allows users to use, computer systems anytime anywhere. For this reason, the requirements for portable electronic devices, such as mobile phones, digital cameras and laptop computers are soaring. Portable electronic devices generally include a memory system including a memory device. The memory system may be used as a main memory unit or an auxiliary memory unit of a portable electronic device.

Memory systems applied to portable electronic devices do not include a mechanical driving unit. Because such memory systems do not have a mechanical driving unit, they exhibit excellent stability and durability. Also, they have generally fast data access rate with low power consumption. Non-limiting examples of a memory system having such advantages include Universal Serial Bus (USB) memory devices, memory cards of diverse interfaces, Solid-State Drives (SSD) and the like. A non-limiting example of a suitable memory device for the memory system includes a non-volatile memory device, such as a flash memory device.

The memory system may store data by programming a plurality of memory cells included in the flash memory device to have different threshold voltage distributions. The memory system may program data in blocks of memory cells which are generally much smaller than the total number of memory cells of the entire memory device. For example, the memory system may program data on the basis of a page of a flash memory.

In a non-volatile memory device storing data in units of pages, when the size of data to be stored is smaller than the data size of a page, the remaining empty space of the page is wasted, which decreases the overall usage efficiency of the storage space of the memory device. Moreover, since the entire page including the empty space is processed as an invalid page when the data are updated, a garbage collection operation is performed more frequently. As the storage capacity of non-volatile memory devices increases, the bigger the size of a page is, the lower the usage efficiency of storage space of the nonvolatile memory devices becomes.

SUMMARY

Embodiments of the present invention are directed to a memory system that may generate and manage information on the size of data and the regions where the data are stored in order to secure data storage space more efficiently, and a method for operating the memory system.

In accordance with an embodiment of the present invention, a method for operating a memory system includes: detecting a size of a data requested by a host; generating a first data that represents the size of the requested data and a second data that represents a remaining empty space other than a space for the requested data in a first region having a unit size of data storage in a memory device when the size of the requested data is smaller than the first region and the request is to write the requested data into the memory device; and storing the first data and the second data in the memory device along with the requested data.

The memory device may include a plurality of memory blocks each of which includes a plurality of memory cells, and the first region may include a first group of memory cells that are coupled to a word line among the plurality of the memory cells.

When the size of the requested data is equal to or smaller than a half of the unit size of data storage, the first data and the second data may be generated and stored in the memory device.

The generating of the first data and the second data may include checking out whether a previous data to be updated with the requested data is stored in the first region.

When no previous data is stored in the first regions, the generating of the first data and the second data may further include generating the second data that represents a remaining empty space other than a space corresponding to the size of the requested data in the first region.

When the previous data is stored in the first regions, the generating of the first data and the second data may further include: checking out an available space of the first region based on the second data regarding the previous data stored in the first region; and comparing a size of the available space of the first region with the size of the requested data.

When the size of the available space of the first region is greater than the size of the requested data, the generating of the first data and the second data may further include generating the second data that represents a remaining empty space other than a space for the requested data and the previous data in the first region.

When the size of the available space of the first region is smaller than the size of the requested data, the generating of the first data and the second data may further include: invalidating the first region and selecting a second region for storing the requested data in the memory device; and generating the second data that represents a remaining empty space other than a space corresponding the size of the requested data in the second region.

The method may further include: reading the first data and the second data regarding the requested data from the memory device when the size of the requested data is smaller than the size of the first region and the request is to read the requested data stored in the first region; and reading and outputting the requested data stored in the first region based on the first and second data regarding the requested data.

In accordance with another embodiment of the present invention, a memory system includes: a memory device that includes a plurality of memory blocks each of which includes a plurality of memory cells; and a controller that controls the memory device to store a data requested by a host in the memory device, wherein the controller detects a size of the requested data and generates a first data that represents the size of the requested data and a second data that represents a remaining empty space other than a space for the requested data in a first region having a unit size of data storage in the memory device when the size of the requested data is smaller than the first region and the request is to write the requested data into the memory device.

The memory blocks each may include a plurality of word lines that are coupled to the plurality of the memory cells, and the first region may include a first group of memory cells that are coupled to a word line among the plurality of the word lines.

When the size of the requested data is equal to or smaller than a half of the unit size of data storage, the controller may generate the first data and the second data.

The controller may store the requested data in a data region of the memory device, and store the first data and the second data in a meta-region of the memory device as meta-data for the requested data.

The controller may include: a detection unit that detects the size of the requested data and enables a detection signal and generates the first data when the size of the requested data is equal to or smaller than a half of the unit size of data storage; an offset checking unit that checks out whether a previous data to be updated with the requested data is stored in the first region in response to the detection signal; and an offset generation unit that generates the second data based on the first data and a checking result obtained by the offset checking unit.

When no previous data is stored in the first region, the offset generation unit may generate the second data that represents a remaining empty space other than a space corresponding to the size of the requested data in the first region based on the first data.

When the previous data is stored in the first region, the offset checking unit may read the second data regarding the previous data stored in the first region.

The offset generation unit may check out an available space of the first region based on the second data regarding the previous data, and compare the size of the requested data with a size of the available space of the first region based on the first data.

When the size of the available space of the first region is greater than the size of the requested data, the offset generation unit may generate the second data that represents a remaining empty space other than a space for the requested data and the previous data in the first region.

When the size of the available space of the first region is smaller than the size of the requested data, the controller may invalidate the first region and select a second region for storing the requested data in the memory device, and the offset generation unit may generate the second data that represents a remaining empty space other than a space corresponding to the size of the requested data in the second region.

The controller may further read the first data and the second data regarding the requested data from the memory device, and read and output the requested data stored in the first region based on the read first and second data when the size of the requested data is smaller than the size of the first region and the request is to read the requested data stored in the first region.

BRIEF DESCRIPTION OF THE DRAWINGS

These and other features and advantages will become more apparent to those skilled in the art to which the present invention pertains by the following detailed description of embodiments of the present invention in reference with the accompanying figures, in which.

DETAILED DESCRIPTION

Figure 1:
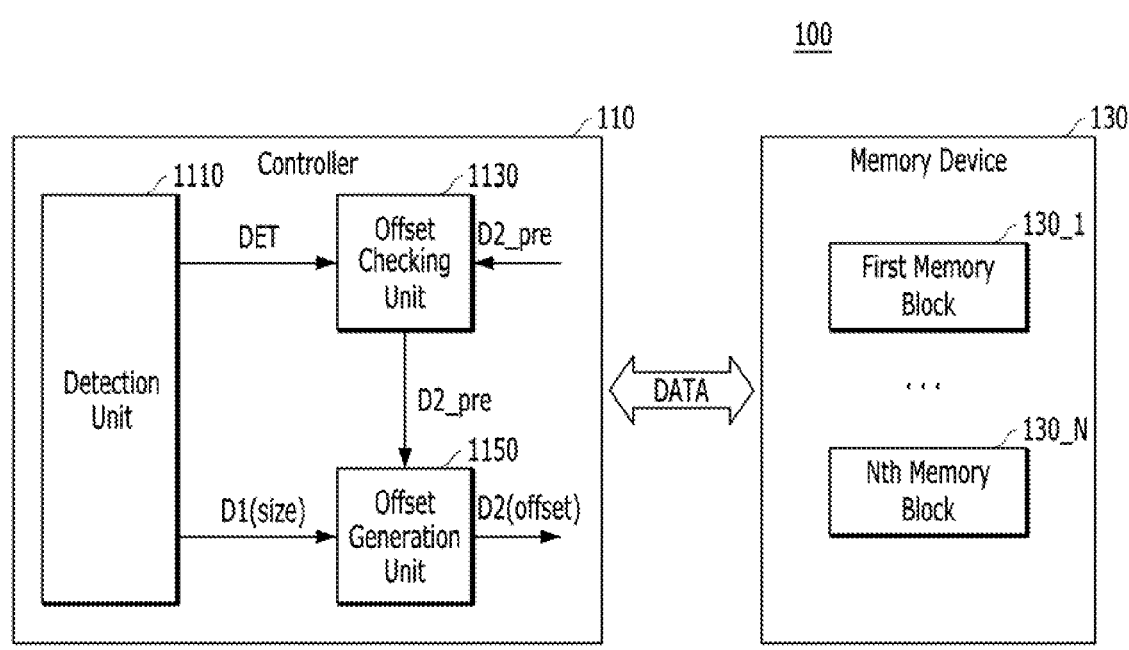
FIG. 1 is a block diagram illustrating a memory system including a memory device, according to an embodiment of the present invention.

Exemplary embodiments of the present invention will be described below in more detail with reference to the accompanying drawings. The present invention may, however, be embodied in different other forms and should not be construed as being limited to the embodiments set forth herein. Rather, these embodiments are provided so that this disclosure will be thorough and complete, and will fully convey the present invention to those skilled in the art to which the present invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sues and intervals for convenience of illustration.

It will be further understood that when an element is referred to as being "connected to", or "coupled to" another element, it may be directly on, connected to, or coupled to the other element, or one or more intervening elements may be present. In addition it will also be understood that when an element is referred to as being "between" two elements, it may be the only element between the two elements, or one or more intervening elements may also be present.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Referring now to FIG. 1, a memory system 100 is provided, according to an embodiment of the present invention.

According to FIG. 1, the memory system 100 includes a memory device 130 for storing data transferred from a host (not shown), and a controller 110 coupled to the memory device 130 for controlling the operation of the memory device 130. The controller 110 controls the transfer of data between the memory device 130 and the host.

The memory system 100 operates in response to a request (also referred to as a command) received from the host (not shown). For example, the memory system 100 may store data which are received from the host in the memory device 130 in response to a write command received form the host (also referred to as a program command or request). In an embodiment, the memory system 100 may be employed as a main memory unit for the host. In another embodiment, the memory system 100 may be employed as an auxiliary memory unit for the host. In yet another embodiment, the memory system 100 may be employed as both a main memory unit and an auxiliary unit for the host.

The memory system 100 may be configured as any suitable storage device which may be coupled to the host according to the host interface protocol. For example, the memory system 100 may be configured as a Solid-State Drive (SSD), a Multi-Media Card (MMC) such as an MMC, an embedded MMC (MMC), a reduced size MMC (RS-MMC) and a micro-MMC a Secure Digital (SD) card such as an SD and a micro-SD, a Universal Storage Bus (USB) storage device, a Universal Flash Storage (UFS) device, a Compact Flash (CF) card, a smart media card, a memory stick and so forth.

The memory system 100 may be included in a computer, an Ultra Mobile Personal Computer (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game player, a vehicle navigator, a black box, a digital camera, a Digital Multimedia Broadcasting (DMB) player, a three-dimensional (3D) television, a smart television, a digital audio recorder, a digital audio player, a digital picture recorder, a digital picture player, a digital video recorder, a digital video player, a storage that constitutes a data center, device for transferring/receiving data in wireless environment, a home network, a computer network, and one among diverse electronic devices that constitute a telematics, a Radio Frequency Identification (RFID) device, and one among diverse constituent elements that form a computing system.

The memory device 130 of the memory system 100 may be a non-volatile memory device such as, for example, a flash memory device, and retain data stored therein even when power is cut off. The memory device 130 may store data, which are transferred from the host, through a write operation, and provide the host with the stored data through a read operation. The memory device 130 includes a plurality of memory blocks 130_1 to 130_N. Each of the memory blocks 130_1 to 130_N may include a plurality of pages, each pages including a plurality of memory cells that are coupled to a single word line. The memory device 130 may have a 3D stack structure. Examples of write and read operations of the memory device 130 will be described in detail later with reference to FIG. 2.

The controller 110 of the memory system 100 controls the memory device 130 in response to a request received from the host. For example, the controller 110 may provide the host with read data that are read out of the memory device 130 in response to a read request received from the host. Otherwise, the controller 110 may store in the memory device 130 write data received together with a write request from the host. Hence the controller 110 controls a read operation, a write operation, and/or an erase operation of the memory device 130.

The controller 110 in accordance with an embodiment of the present invention, may store write data received from the host together with a write command in a selected group of memory cells among the memory cells included in the memory device 130. For example, the controller 110 may store data by a unit of memory cells corresponding to one page in the memory device 130. When the size of the data to be stored is smaller than the size of the page, the controller 110 may set an offset value for the remaining empty space of the page i.e., the space of the page other than the space used for storing the data in the page and may store the offset value in the memory device 130 along with the data. For example, when the size of the data to be stored is equal to or less than a half of the size of a selected page, the controller 110 may generate a first data D1 that represents the size of the data to be stored in the selected page and a second data D2 that represents the offset value for the remaining empty space in the selected page, as meta data of the data, and store the first data D1 and the second data D2 in the memory device 130 along with the data.

Referring to FIG. 1, the controller 110 may include a detection unit 1110, an offset checking unit 1130, and an offset generation unit 1150.

The detection unit 1110 of the controller 110 detects the size of the data to be stored in a selected page. When the size of the data is equal to or less than a predetermined reference value, the detection unit 1110 may generate a detection signal DET and the first data D1 of the data. The first data D1 may include information on the detected size of the transferred data to be stored in the selected page.

For example, when a write/read operation is performed to the memory device 130 by the unit of a page, the predetermined reference value may correspond to one half of the size of the page, and therefore, when the data transferred from the host is of a size equal to or less than one half of the size of the page, the detection unit 1110 may enable the detection signal DET and may also generate the first data D1.

The offset checking unit 1130 may check out whether there are previous data stored in the selected page of the memory device 130 that need to be updated or replaced with the transferred data in response to the detection signal DET received from the detection unit 1110. For example, every time data is stored in the memory device 130, the controller 110 maps a logical address LA assigned by the host for the data to a physical address PA of the memory device 130 where the data is actually stored in the memory device 130. The controller manages this mapping information by storing it in a mapping table (not shown) and updating as may be needed. Hence, the offset checking unit 1130 may check out whether or not there are previous data stored in the selected page by referring to the mapping information stored in the mapping table.

Moreover, in addition to checking whether or not there are previous data stored in the selected page as described above, the offset checking unit 1130 also checks out the offset value set for the selected page based on the previous data. More specifically, when there are previous data stored in the memory device 130 that need to be updated or replaced with the newly received data (also referred to as the transferred data) the offset checking unit 1130 reads a second data D2_pre of the previous data, which stored along with the previous data, from the memory device 130 and check out the information of the second data D2_pre. The second data D2_pre represents the offset value set for the selected page due to the previous data currently stored in the selected page. In other words, the second data D2_pre represent the available empty space in the selected page that is not occupied by the previous data which are currently stored in the selected page. Then, the offset checking unit 1130 may output the second data D2_pre to the offset generation unit 1150. If there are no previous data stored in the selected page of the memory device 130, the offset checking unit 1130 may disable the second data D2_pre.

The offset generation unit 1150 of the controller 110 may generate a second data D2 of the transferred data (Le, the newly received data) to be stored in the selected page, which is a current offset value of the transferred data, based on the first data D1 representing the size of the transferred data and on the checking result of the offset checking unit 1130. For example, as stated earlier, when the transferred data is detected to have a size smaller than the size of a page, the detection unit 1110 outputs to the offset generation unit the first data D1 representing information on the detected size of the transferred data. The offset generation unit 1150 may then generate, based on the received first data D1 the third data D2 i.e., the current offset value representing the remaining empty space of the selected page other than the space needed for storing the transferred data to be currently stored in the selected page.

Specifically, when the offset checking unit 1130 determines that there are previous data which are stored in the selected page of the memory device 130 that need to be updated or replaced with the transferred data, the offset checking unit 1130 reads the second data D2_pre of the previous data and transfers the second data D2_pre to the offset generation unit 1150. Then, the offset generation unit 1150 may determine the available space in the selected page based on the second data D2_pre received from the offset checking unit 1130. Also, the offset generation unit 1150 compares the detected size of the transferred data as indicated by the first data D1 with the size of the available space as indicated by the second data D2_pre received from the offset checking unit 1130.

As a result of the comparison in the offset generation unit 1150, when it turns out that the available space of the selected page is greater than the detected size of the transferred data to be stored in the selected page, the controller will perform the write operation and store the transferred data in the available space of the selected page. Also, the offset generation unit 1150 generate the second data D2 of the transferred data, which represents the available region of the selected page other than the region corresponding to the transferred data and the previously stored data. This way the memory system may store the newly received data in a page having previous data stored therein without the need to erase the page.

On the other hand, when it turns out from the comparison result that the available space of the selected page is smaller than the detected size of the transferred data to be stored in the selected page, the controller 110 may invalidate the page, select another page for the transferred data, and store the transferred data in the newly selected page. Then, the offset generation unit 1150 may generate the second data D2 of the transferred data, which is the offset value of the newly selected page representing the remaining empty space other than the space for the transferred data in the newly selected page.

The first data D1 and the second data D2 generated in the controller 110 may be stored in the memory device 130 along with the transferred data. The operation of transferring and storing, the data to and in the memory device 130 will be described in detail later with reference to FIG. 3.

Figure 2:
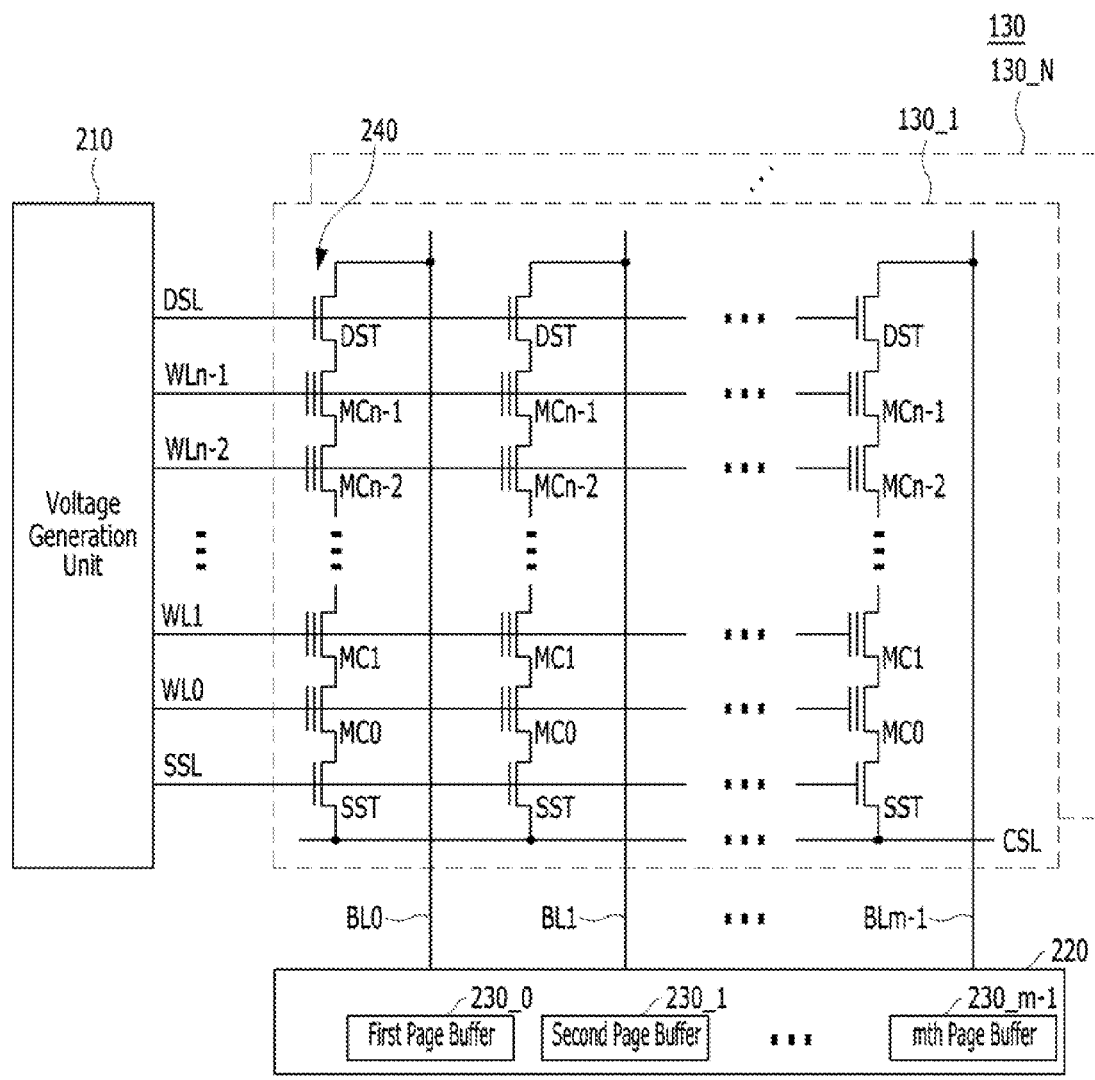
FIG. 2 is a block diagram illustrating a configuration of the memory device of FIG. 1, according to an embodiment of the present invention.

FIG. 2 is a block diagram illustrating a configuration example of the memory device 130 of the memory system 100 of FIG. 1. Particularly, FIG. 2 illustrates a first memory block 130_1 representatively among the memory blocks 130_1 to 130_N included in the memory device 130. The memory device 130, in accordance with the embodiment of FIG. 2, may further include a voltage generation unit 210 and a read/write unit 220. It is noted herein, that FIG. 2 is a simplified schematic and as such does not illustrate well known configuration details of the memory device which are not necessary for the understanding of the present invention.

The first memory block 130_1 of the memory device 130 may include a plurality of cell strings 240, that are respectively coupled to bit lines BL0 to BLm-1. Cell strings 240 of each column may include at least one drain selection transistor DST and at least one source selection transistor SST. A plurality of memory cells or memory cell transistors MC0 to MCn-1 are serially connected between the drain selection transistor DST and the source selection transistor SST. Each of the memory cells may be a single-level cell storing single bit data or a multi-level cell storing multiple bit data. The cell strings 240 may be electrically connected to the corresponding bit lines BL0 to BLm-1 respectively.

Although FIG. 2 shows an example of the first memory block 130_1 which is formed of NAND flash memory cells, the memory block 130_1 of the memory device 130 in accordance with the embodiment of the present invention is not limited to the NAND flash memory only. For example, the memory block 130_1 of the memory device 130 may be a NOR-type flash memory, a hybrid flash memory that is a combination of more than two kinds of memory cells, and a one-NAND flash memory with a controller included inside a memory chip. The operation characteristics of the semiconductor device of the present invention may be applied not only to a flash memory device having a charge storing layer formed of a conductive floating gate but a so to a Charge Trap Flash (CTF) having an insulation layer as a charge storing layer. Also, the operation characteristics of a semiconductor device may be applied to a semiconductor device that stores data based on the characteristics of switching between different resistance levels according to a voltage or current applied thereto, such as a Resistive Random Access Memory (RAM), a Phase-Change Random Access Memory (PRAM), a Ferroelectric Random Access Memory (FRAM), a Magnetic Random Access Memory (MRAM), an e-fuse and the like.

The voltage generation unit 210 of the memory device 130 may provide word line voltages (e.g., a program voltage, a read voltage, and a pass voltage) to be supplied to the word lines and voltages to be supplied to bulk (e.g., well region) where memory cells are formed according to an operation mode. Herein, the voltage generation operation of the voltage generation unit 210 may be performed under the control of a control circuit (not shown). Also, the voltage generation unit 210 may generate a plurality of variable read voltages to generate a plurality of read data, select one memory block among the memory blocks (or sectors) of a memory cell array in response to the control of the control circuit, select a word line among the word lines of the selected memory block, and supply the word line voltages to the selected word line and the other word lines that are not selected.

The read/write unit 220 of the memory device 130 also operates under the control of the control circuit. The read/write unit 220 may operate as a sense amplifier or a write driver according to the operation mode. For example, during a verification operation and a normal read operation, the read/write unit 220 may operate as a sense amplifier for reading data from the memory cell array. During a program operation, the read/write unit 220 may operate as a write driver that drives the bit lines based on the data to be stored in the memory cell array. During a program operation, the read/write unit 220 may receive data to be written in the memory cell array from a buffer (not shown), and drive the bit lines based on the inputted data. To this end, the read/write unit 220 may include a plurality of page buffers 230_0 to 230m-1 that respectively correspond to the columns (or bit lines) column pairs (or bit line pairs).

Therefore, as the voltage generation unit 210 supplies the program voltage (or the read voltage) to the selected word line among the word lines of the first memory block 130_1 and supplies a prevention voltage (or the pass voltage) to the other word lines that are not selected, a write operation (or a read operation) may be performed between the memory cells coupled to the selected word line and the page buffers 230_0 to 230m-1. In other words, the memory cells coupled to the same word line among the multiple word lines of the first memory block 130_1 may constitute one group, which is a page, and the write/read operation of the data may be performed on the basis of a page.

Figure 3:
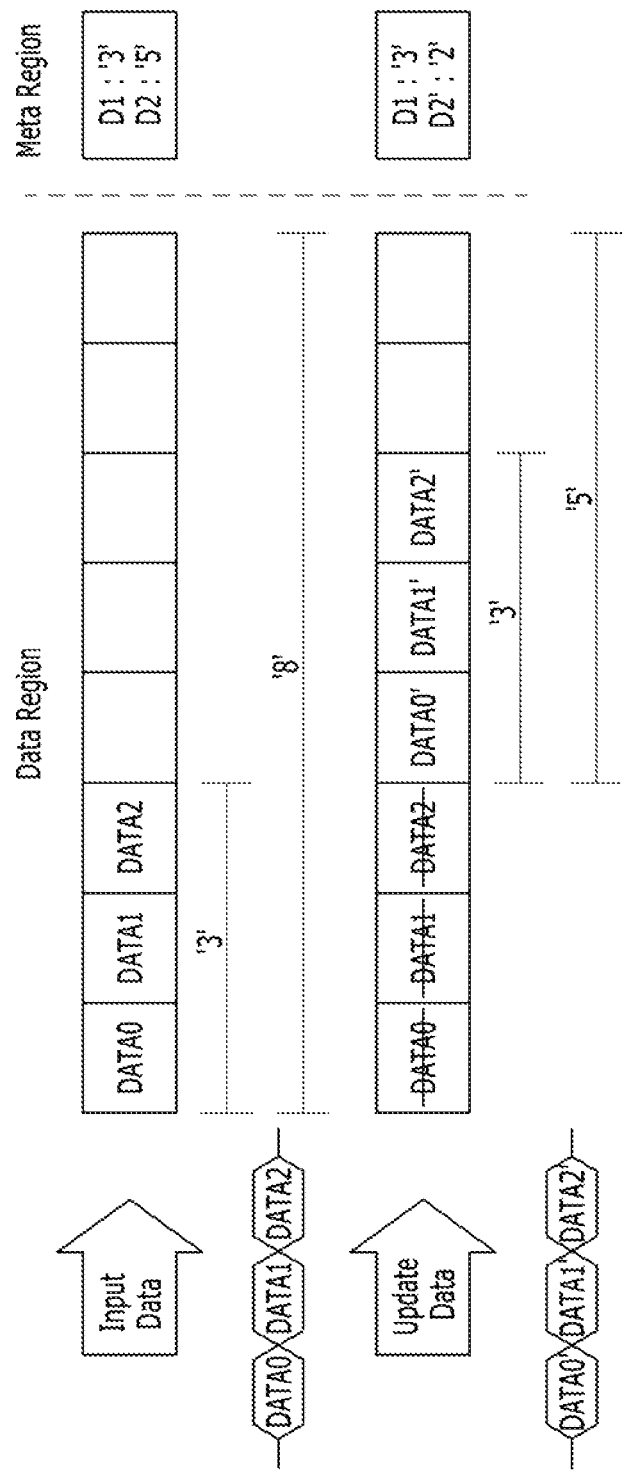
FIG. 3 illustrates an operation of the memory device of FIG. 2, according to an embodiment of the present invention.

FIG. 3 illustrates an operation of the memory device 130 of FIG. 2. FIG. 3 exemplifies a single page as the unit of data storage in the first memory block 130_1 of the memory device 130. More specifically, as a non-limiting example, FIG. 3 exemplifies a single page having the size of approximately 4 KB which is divided into 8 segments, each segment having the size of approximately 512 B.

Referring to FIG. 3, the upper single page shows the memory device 130 storing the currently transferred data DATA0 to DATA2 in a selected page having no previous data. That is, the currently transferred data DATA0 to DATA2 are the new data. The lower single page shows the memory device 130 updating the previous data DATA0 to DATA2 with the currently transferred data DATA0' to DATA2' in the selected page having the previous data DATA0 to DATA2. As described earlier, data are written/read by the units of pages. Therefore, the storage space is not wastefully used when the data to be written/read has the same size as a single page (e.g., approximately 4 KB). On the other hand, when the size of the data to be written/read is smaller than a single page, the remaining empty space other than the space for the to-be-written/read data is wasted.

According to an embodiment of the present invention, the write/read operation is performed without waste of the storage space even when the size of the data to be stored is smaller than the unit of the data storage, e.g., in this example the size of a single page. That is, the data may be updated in a smaller size than a single page e.g., approximately 512 B).

Referring to the upper page of FIG. 3, when the data DATA0, DATA1 and DATA2 are newly transferred from the host, the controller may control the memory device 130 to allocate/select a new page having no previous data and store the data DATA0, DATA1, and DATA2 in the selected page. Since the size (corresponding to the size of 3 segments of the selected page, as shown in the upper page of FIG. 3) of the transferred data DATA0, DATA1 and DATA2 is smaller than a half of the whole size (corresponding to the size of 8 segments of the selected page, as shown in FIG. 3) of the selected page, the detection unit 1110 enables the detection signal DET and generates the first data D1 representing the size of the data DATA0 to DATA2 i.e., the size of 3 segments of the selected page. Also, the offset generation unit 1150 may generate the second data D2 as an offset value for the selected page based on the transferred data representing the remaining empty space i.e., the size of 5 segments of the selected page which will remain empty when the data DATA0 to DATA2 is stored in the selected page. The generated first data D1 and the second data D2 may be transferred to the memory device 130 along with the data DATA0, DATA1 and DATA2 and stored therein. FIG. 3 exemplifies the first and second data D1 and D2 stored in a meta-region for metadata of the stored data of the memory device 130, as the metadata of the data DATA0, DATA1 and DATA2.

The controller 110 may allocate one or more of the memory blocks 130_1 to 130_N as the meta region of the memory device 130 and store metadata of the data stored in the memory device 130. Although FIG. 3 shows an example that the first data D1 and the second data D2 transferred to the memory device 130 are stored in the meta-region as the metadata, the scope of the present invention is not limited in this way. For example, the first data D1 and the second data D2 may be stored in an empty or spare space of a data region along with the data DATA0, DATA1 and DATA2.

Referring to the lower page of FIG. 3, when data DATA0' to DATA2' is transferred from the host in order to update the previous data DATA0 to DATA2 stored in the selected page, the detection unit 1110 may detect the size of the transferred data DATA0' to DATA2'. The size of the transferred data DATA0' to DATA2' is smaller than a half of the whole size of the selected page. Therefore, the detection unit 1110 may generate the detection signal DET and the first data D1' representing the size of the transferred data DATA0' to DATA2'. According to the detection signal DET, the offset checking unit 1130 may read from the memory device 130 the second data D2 of the previous data DATA0 to DATA2 (corresponding to the size of segments of the selected page). The offset generation unit 1150 may figure out the available space in the selected page based on the second data D2. Based on the first data D1' representing the size of the transferred data DATA0' to DATA2' and the second data D2 of the previous data DATA0 to DATA2, the offset generation unit 1150 may generate a second data D2' of transferred data DATA0 to DATA2', representing the remaining empty space (corresponding to 2 segments of the selected page) other than the space for the previous data DATA0 to DATA2 and the transferred data DATA0' to DATA2'.

To be specific, when the size (corresponding to 5 segments of the selected page) of the available space of the selected page is greater than the size (corresponding to 3 segments of the selected page) of the transferred data DATA0' DATA1' and DATA2' as shown in FIG. 3, the controller 110 may store the transferred data DATA0', DATA1' and DATA2' in the available space of the selected page. Herein, the offset generation unit 1150 may generate the second data D2' of the transferred data DATA0', DATA1' and DATA2' (corresponding to the remaining 2 segments of the selected page), which represents the remaining empty space other than the space for the previous data DATA0 to DATA2 and the transferred data DATA0' to DATA2' as the offset value of the selected page.

Although not illustrated in FIG. 3 when the size e.g., the size corresponding to 2 segments of the selected page) of the available space of the selected page is smaller than the size (e.g., the size corresponding to 3 segments of the selected page) of a transferred data DATA0", DATA1" and DATA2" for the update of the previous data DATA0' to DATA2', the controller 110 may invalidate the selected page and select another new page for the transferred data DATA0", DATA1" and DATA2". The offset generation unit 1150 then may generate the second data D2" of the transferred data DATA0", DATA1" and DATA2", which represents the remaining empty space (having the size corresponding to 5 segments of the newly selected page) other than the space for the transferred data DATA0" to DATA2".

According to the embodiment of the present invention, when the controller 110 reads the data DATA0', DATA1' and DATA2' stored in the memory device 130, the controller 110 reads the first data D1' and the second data D2' that are stored along with the data DATA0', DATA1' and DATA2' to figure out the region where the data DATA0', DATA1' and DATA2' are stored, and reads the data DATA0', DATA1' and DATA2'. In other words, based on the second data D2' representing the remaining empty space (e.g., corresponding to 2 segments) in the selected page, it is possible to figure out the region (e.g., corresponding to 6 segments other than the 2 segments in the selected page) where the data DATA0', DATA1' and DATA2' and its previous data are stored. The data DATA0', DATA1' and DATA2' may be read based on the first data D1' (e.g., the size of 3 segments).

Also, since the second data D2 have to be updated continuously, they may be stored in a format similar to bitmap without an encoding operation. In short, the second data D2 that represents the value of '5' and '2' in FIG. 3 may be generated and stored as the values of '11100000' and '11111100'.

Figure 4:
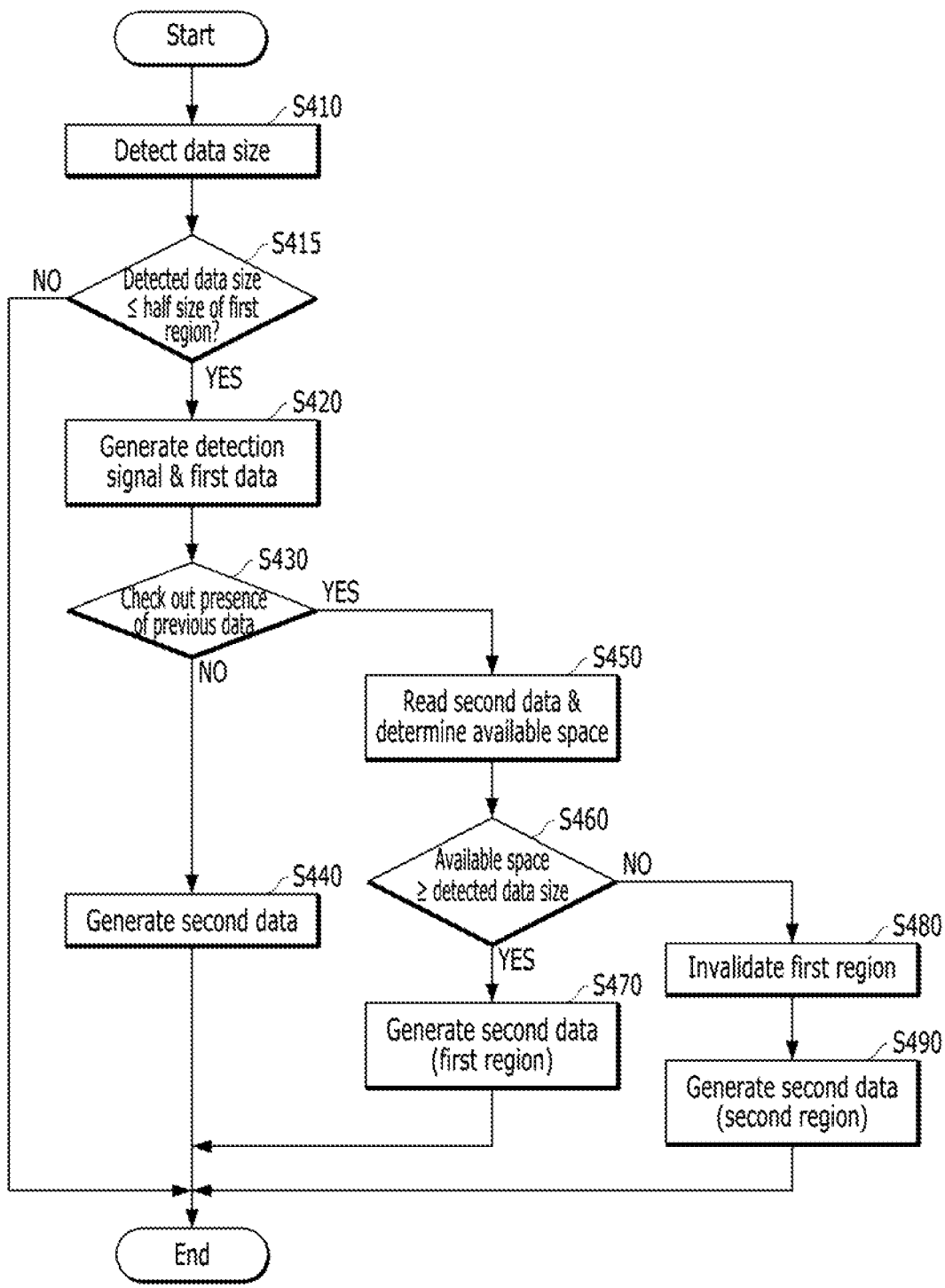
FIG. 4 is a flowchart illustrating a write operation of the memory system of FIG. 1, according to an embodiment of the present invention.

FIG. 4 is a flowchart illustrating a write operation of the memory system 110 according to an embodiment of the present invention.

At step S410 when a write operation is initiated upon receipt of a write command by a host, the detection unit 1110 of the controller 110 detects the size of the data transferred from the host for storage in a selected unit region (e.g., a first region) for the memory device. Then the controller, at step 415 determines whether the detected data size is equal to or smaller than a half of the size of the selected unit region e.g., the size of the selected page of the memory device 130. When the size of the transferred data is equal to or smaller than the half of the size of the selected page in the memory device 130 (YES at step 415), at step S420, the detection unit 1110 may then generate the detection signal DET and also the first data D1 representing the size of the transferred data from the host corresponding to the received write command. When the size of the transferred data is greater than the half of the size of the selected page in the memory device 130 (NO at step 415) the transferred data may be stored in the selected page and the process may end.

At step S430, the offset checking unit 1130 may check out whether there are previous data to be updated or replaced with the transferred data in the selected page of the memory device 130 in response to the detection signal DET received from the detection unit 1110. As explained earlier, the offset checking unit 1130 may check out whether there are previous data stored in the selected page of the memory device 130 by finding a physical address PA corresponding to the logical address LA of the transferred data from a mapping table. When it turns out from the checking of step S430 that there are no previous data in the selected page of the memory device 130 (NO at step S430), at step S440, the offset generation unit 1150 may generate the second data D2 as the offset value, which represents the remaining empty space other than the space for the detected sized of the transferred data in the selected page, based on the first data D1. The transferred data may be stored in the selected page and the process may end.

When it turns out from the checking of step S430 that there are previous data to be updated or replaced with the transferred data in the memory device 130 (YES at step S430), the offset checking unit 1130 may read the second data D2_pre, which is the offset value representing the remaining empty space due to the previous data in the selected page, from the memory device 130 at step S450. The offset generation unit 1150 may determine the remaining empty space due to the previous data in the selected page based on the read second data D2_pre.

At step S460, the offset generation unit 1150 may compare the detected size of the transferred data with the size of the empty space or the available space in the selected page having the previous data based on the first data D1 inputted from the detection unit 1110 and the second data D2_pre read by the offset checking unit 1130. When it turns out from the comparison of step S460 that the available space is greater than the detected size of the transferred data (YES at step S450), the offset generation unit 1150 may generate the second data D2 as the offset value, which represents the remaining empty space other than the space for the detected sized of the transferred data in the available space.

When it turns out from the comparison of step S460 that the available space of the selected page is smaller than the detected size of the transferred data (NO at step S460), the controller 110 may invalidate the first region at step S480, and select another page for the transferred data as a second region. As a result, the offset generation unit 1150 may generate the second data D2 as the offset value, which represents the remaining empty space other than the space for the detected size of the transferred data in the newly selected page at step S490. The transferred data may be stored in the newly selected page and the process may end.

According to an embodiment of the present invention as described above, it is possible to additionally attain data storage space in a memory device by generating and managing information on the empty space of a selected region (e.g., a page) where data are already programmed, when new data are programmed in the memory device. More specifically, the present invention allows writing data in the empty space of a selected region (e.g., a selected page) even when the selected region is already partially written (i.e., contains programmed memory cells storing previous data) when the detected size of the write data is less than the detected available space of the selected region. Therefore, storage space of a memory device which heretofore was wasted may now be used, thereby increasing the storage space use efficiency of the memory device. This in turn may also increase the lifecycle of the memory device.

According to the present invention, storage space of a memory device may be effectively increased by better utilization of the available empty storage space of already partially programmed memory regions. The present invention, reduces waste of memory space by generating and managing information on the empty space, when data of a size smaller than a unit of data operation (e.g., the unit of a page) are programmed in a memory device where data are programmed by the unit of data operation. In this way, it also becomes possible to reduce the storage space that is to be invalidated when the data are updated later. Therefore, the frequency of a garbage collection operation may also be substantially reduced.

Since the garbage collection operation is performed less frequently, the number of times that a memory block erase operation is performed is decreased as well. This leads to increased lifespan of the memory device. Moreover, the storage space utility efficiency of the memory device may be improved, too.

While the present invention has been described with respect to the specific embodiments, it will be apparent to those skilled in the art that various changes and modifications may be made without departing from the spirit and scope of the invention as defined in the following claims.

What is claimed is:

1. A method for operating a memory system, comprising:
   detecting a size of a data requested by a host;
   generating a detection signal and a first data that represents the size of the requested data when the size of the requested data is smaller than a first region having a unit size of data storage in a memory device and the request is to write the requested data into the memory device;
   checking out whether a previous data to be updated with the requested data is stored in the first region in response to the detection signal;
   generating a second data that represents a remaining empty space other than a space for the requested data in the first region based on the first data and a result of the checking out; and
   storing the first data and the second data in the memory device along with the requested data.

2. The method of claim 1,
   wherein the memory device includes a plurality of memory blocks each of which includes a plurality of memory cells, and
   wherein the first region includes a first group of memory cells that are coupled to a word line among the plurality of the memory cells.

3. The method of claim 1, wherein when the size of the requested data is equal to or smaller than a half of the unit size of data storage, the first data and the second data are generated and stored in the memory device.

4. The method of claim 3, wherein when no previous data is stored in the first regions in the result of the checking out, the generating of the second data includes:
   generating the second data that represents a remaining empty space other than a space corresponding to the size of the requested data in the first region.

5. The method of claim 3, wherein when the previous data is stored in the first regions in the result of the checking out, the generating of the second data includes:
   checking out an available space of the first region based on the second data regarding the previous data stored in the first region; and
   comparing a size of the available space of the first region with the size of the requested data.

6. The method of claim 5, wherein when the size of the available space of the first region is greater than the size of the requested data, the generating of the second data further includes:
   generating the second data that represents a remaining empty space other than a space for the requested data and the previous data in the first region.

7. The method of claim 5, wherein when the size of the available space of the first region is smaller than the size of the requested data, the generating of the second data further includes:
   invalidating the first region and selecting a second region for storing the requested data in the memory device; and
   generating the second data that represents a remaining empty space other than a space corresponding to the size of the requested data in the second region.

8. The method of claim 1, further comprising:
   reading the first data and the second data regarding the requested data from the memory device when the size of the requested data is smaller than the size of the first region and the request is to read the requested data stored in the first region; and
   reading and outputting the requested data stored in the first region based on the first and second data regarding the requested data.

9. A memory system, comprising:
   a memory device that includes a plurality of memory blocks each of which includes a plurality of memory cells; and
   a controller that controls the memory device to store a data requested by a host in the memory device,
   wherein the controller detects a size of the requested data and generates a first data that represents the size of the requested data and a second data that represents a remaining empty space other than a space for the requested data in a first region having a unit size of data storage in the memory device when the size of the requested data is smaller than the first region and the request is to write the requested data into the memory device,
   wherein the controller includes:
   a detection unit that detects the size of the requested data, and enables a detection signal and generates the first data when the size of the requested data is equal to or smaller than a half of the unit size of data storage;

an offset checking unit that checks out whether a previous data to be updated with the requested data is stored in the first region in response to the detection signal; and an offset generation unit that generates the second data based on the first data and a checking result obtained by the offset checking unit.

10. The memory system of claim 9, wherein the memory blocks each includes a plurality of word lines that are coupled to the plurality of the memory cells, and wherein the first region includes a first group of memory cells that are coupled to a word line among the plurality of the word lines.

11. The memory system of claim 9, wherein when the size of the requested data is equal to or smaller than the half of the unit size of data storage, the controller generates the first data and the second data.

12. The memory system of claim 9, wherein the controller stores the requested data in a data region of the memory device, and stores the first data and the second data in a meta-region of the memory device as meta-data for the requested data.

13. The memory system of claim 10, wherein when no previous data is stored in the first region, the offset generation unit generates the second data that represents a remaining empty space other than a space corresponding to the size of the requested data in the first region based on the first data.

14. The memory system of claim 10, wherein when the previous data is stored in the first region, the offset checking unit reads the second data regarding the previous data stored in the first region.

15. The memory system of claim 14, wherein the offset generation unit checks out an available space of the first region based on the second data regarding the previous data, and compares the size of the requested data with a size of the available space of the first region based on the first data.

16. The memory system of claim 15, wherein when the size of the available space of the first region is greater than the size of the requested data, the offset generation unit generates the second data that represents a remaining empty space other than a space for the requested data and the previous data in the first region.

17. The memory system of claim 15, wherein when the size of the available space of the first region is smaller than the size of the requested data, the controller invalidates the first region and selects a second region for storing the requested data in the memory device, and the offset generation unit generates the second data that represents a remaining empty space other than a space corresponding to the size of the requested data in the second region.

18. The memory system of claim 9, wherein the controller further reads the first data and the second data regarding the requested data from the memory device, and the controller reads and outputs the requested data stored in the first region based on the read first and second data when the size of the requested data is smaller than the size of the first region and the request is to read the requested data stored in the first region.

* * * * *